United States Patent
Degawa

(10) Patent No.: US 10,680,165 B2
(45) Date of Patent: *Jun. 9, 2020

(54) MAGNETORESISTANCE EFFECT DEVICE HAVING MAGNETIC MEMBER WITH CONCAVE PORTION

(71) Applicant: TDK CORPORATION, Tokyo (JP)

(72) Inventor: Naomichi Degawa, Tokyo (JP)

(73) Assignee: TDK CORPORATION, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/208,191

(22) Filed: Dec. 3, 2018

(65) Prior Publication Data

US 2019/0181332 A1 Jun. 13, 2019

(30) Foreign Application Priority Data

Dec. 7, 2017 (JP) .................... 2017-235226

(51) Int. Cl.
*H01L 43/08* (2006.01)
*H01P 1/203* (2006.01)
(Continued)

(52) U.S. Cl.
CPC ............ *H01L 43/08* (2013.01); *G11C 11/161* (2013.01); *G11C 11/1673* (2013.01);
(Continued)

(58) Field of Classification Search
CPC ......... H01L 43/08; H01L 43/02; H01L 43/10; H01F 10/329; H01P 1/203; H01P 1/218; G11C 11/18; G11C 11/19
See application file for complete search history.

(56) References Cited

U.S. PATENT DOCUMENTS 6,466,419 B1 10/2002 Mao
6,603,641 B1 * 8/2003 Sasaki .................. G11B 5/3116
29/603.24
(Continued)

FOREIGN PATENT DOCUMENTS

JP 2017-063397 A 3/2017
JP 2017-153066 A 8/2017
WO 2007/032149 A1 3/2007

OTHER PUBLICATIONS

A.A. Tulapurkar et al.; "Spin-torque diode effect in magnetic tunnel junctions"; Reprinted from nature; International weekly journal of science; Nov. 17, 2005; vol. 438; No. 7066; pp. 339-342.

(Continued)

*Primary Examiner* — Mushfique Siddique
(74) *Attorney, Agent, or Firm* — Oliff PLC

(57) ABSTRACT

A magnetoresistance effect device includes: a magnetoresistance effect element formed by performing lamination such that a spacer layer is disposed between a first ferromagnetic layer and a second ferromagnetic layer; a high frequency signal line arranged on one side of the magnetoresistance effect element in a direction parallel to a lamination direction; and a magnetic member arranged at a position further away from the one side than the high frequency signal line when viewed from the magnetoresistance effect element, wherein the magnetic member has a concave portion which is recessed in a direction away from the high frequency signal line in a surface facing the high frequency signal line.

8 Claims, 5 Drawing Sheets

(51) Int. Cl.
*H01F 10/32* (2006.01)
*H01L 43/02* (2006.01)
*G11C 11/18* (2006.01)
*G11C 11/19* (2006.01)
*G11C 11/16* (2006.01)
*H01L 43/10* (2006.01)
*H01P 1/218* (2006.01)

(52) U.S. Cl.
CPC .............. *G11C 11/18* (2013.01); *G11C 11/19* (2013.01); *H01F 10/329* (2013.01); *H01L 43/02* (2013.01); *H01P 1/203* (2013.01); *H01L 43/10* (2013.01); *H01P 1/218* (2013.01)

(56) References Cited

U.S. PATENT DOCUMENTS

| | | |
|---|---|---|
| 6,700,760 B1 | 3/2004 | Mao |
| 7,280,325 B1 | 10/2007 | Pan |
| 2009/0185315 A1 | 7/2009 | Xue et al. |
| 2010/0232072 A1 | 9/2010 | Dimitrov et al. |
| 2010/0276791 A1* | 11/2010 | Kaneko ............... H01L 23/5225 257/659 |
| 2016/0277000 A1 | 9/2016 | Shibata et al. |
| 2017/0244377 A1* | 8/2017 | Yamane .................. H03H 2/00 |
| 2018/0309046 A1* | 10/2018 | Urabe ..................... H01L 43/08 |
| 2018/0316077 A1 | 11/2018 | Yamane et al. |
| 2019/0044500 A1* | 2/2019 | Degawa ................. H03H 2/00 |
| 2019/0180901 A1* | 6/2019 | Kaizu ................. H01F 10/3259 |
| 2019/0304491 A1* | 10/2019 | Degawa ............... G01R 33/093 |
| 2019/0305215 A1* | 10/2019 | Degawa ................ G01R 33/09 |

OTHER PUBLICATIONS

K. Konishi et al. "Radio-frequency amplification property of the MgO-based magnetic tunnel junction using field-induced ferromagnetic resonance". Applied Physics Letters, vol. 102, pp. 162409-1-162409-4, (2013).
Sep. 30, 2019 Office Action issued in U.S. Appl. No. 16/364,534.
Mar. 11, 2020 Office Action Issued in U.S. Appl. No. 16/364,534.

* cited by examiner

MAGNETORESISTANCE EFFECT DEVICE HAVING MAGNETIC MEMBER WITH CONCAVE PORTION

The disclosure relates to a magnetoresistance effect device using a magnetoresistance effect element.

Priority is claimed on Japanese Patent Application No. 2017-235226, filed Dec. 7, 2017, the content of which is incorporated herein by reference.

BACKGROUND

In recent years, as mobile communication terminals such as cellular phones have become more sophisticated, the speed of wireless communication has increased. Since a communication speed is proportional to the bandwidth of a frequency to be used, a frequency band required for communication has increased and accordingly the number of installed high frequency filters required for mobile communication terminals has also increased. Furthermore, research on the field of spintronics which is expected to be applied to new high frequency components has been actively conducted. One of the phenomena attracting attention in this field is a spin torque resonance phenomenon by a magnetoresistance effect element (refer to Nature, Vol. 438, no. 7066, pp. 339 to 342, 17 Nov. 2005).

For example, when an alternating current (AC) current is caused to flow to a magnetoresistance effect element and at the same time that a static magnetic field is applied using a magnetic-field applying mechanism, ferromagnetic resonance can be caused in the magnetization of a magnetization free layer included in the magnetoresistance effect element and a resistance value of a magnetoresistance effect element oscillates periodically at a frequency corresponding to a ferromagnetic resonance frequency. Furthermore, the resistance value of the magnetoresistance effect element also oscillates when a high frequency magnetic field is applied to the magnetization free layer in the magnetoresistance effect element. A ferromagnetic resonance frequency changes in accordance with the intensity of the static magnetic field applied to the magnetoresistance effect element and this resonance frequency is generally included in a high frequency band of several to several tens of GHz.

Japanese Unexamined Patent Application, First Publication No. 2017-63397 describes a technique for changing a ferromagnetic resonance frequency by changing the intensity of a magnetic field applied to a magnetoresistance effect element and proposes a device such as a high frequency filter using this technique.

Examples of a magnetic-field applying mechanism configured to apply a magnetic field to a magnetoresistance effect element include an electromagnet type and a strip line type in Japanese Unexamined Patent Application, First Publication No. 2017-63397, but a detailed constitution thereof is not described. As a method of applying a magnetic field to a magnetoresistance effect element, generally, a method of applying a magnetic field generated from a magnetic member such as a yoke to a magnetoresistance effect element is conceivable. However, the inventor's research has found in this method that there is a concern of deterioration of a high frequency characteristic of a device due to a capacitance component present between a yoke and a high frequency signal line.

BRIEF SUMMARY OF THE INVENTION

The disclosure was made in view of the above circumstances and an objective of the disclosure is to provide a magnetoresistance effect device capable of reducing a capacitance component present between a magnetic member used as a magnetic-field applying mechanism and a high frequency signal line.

In order to achieve the objective, the disclosure provides the following means.

A magnetoresistance effect device according to an aspect of the disclosure includes: a magnetoresistance effect element including a first ferromagnetic layer, a second ferromagnetic layer, and a spacer layer; a high frequency signal line arranged on one side of the magnetoresistance effect element in a direction parallel to a lamination direction; and a magnetic member arranged on the one side of the magnetoresistance effect element, wherein in the magnetoresistance effect element, the first ferromagnetic layer, the second ferromagnetic layer, and the spacer layer are laminated such that the spacer layer is disposed between the first ferromagnetic layer and the second ferromagnetic layer, wherein the magnetic member is arranged further away from the magnetoresistance effect element in the direction parallel to the lamination direction than the high frequency signal line, and wherein the magnetic member has a concave portion which is recessed in a direction away from the high frequency signal line in a surface facing the high frequency signal line.

DETAILED DESCRIPTION

Figure 1:
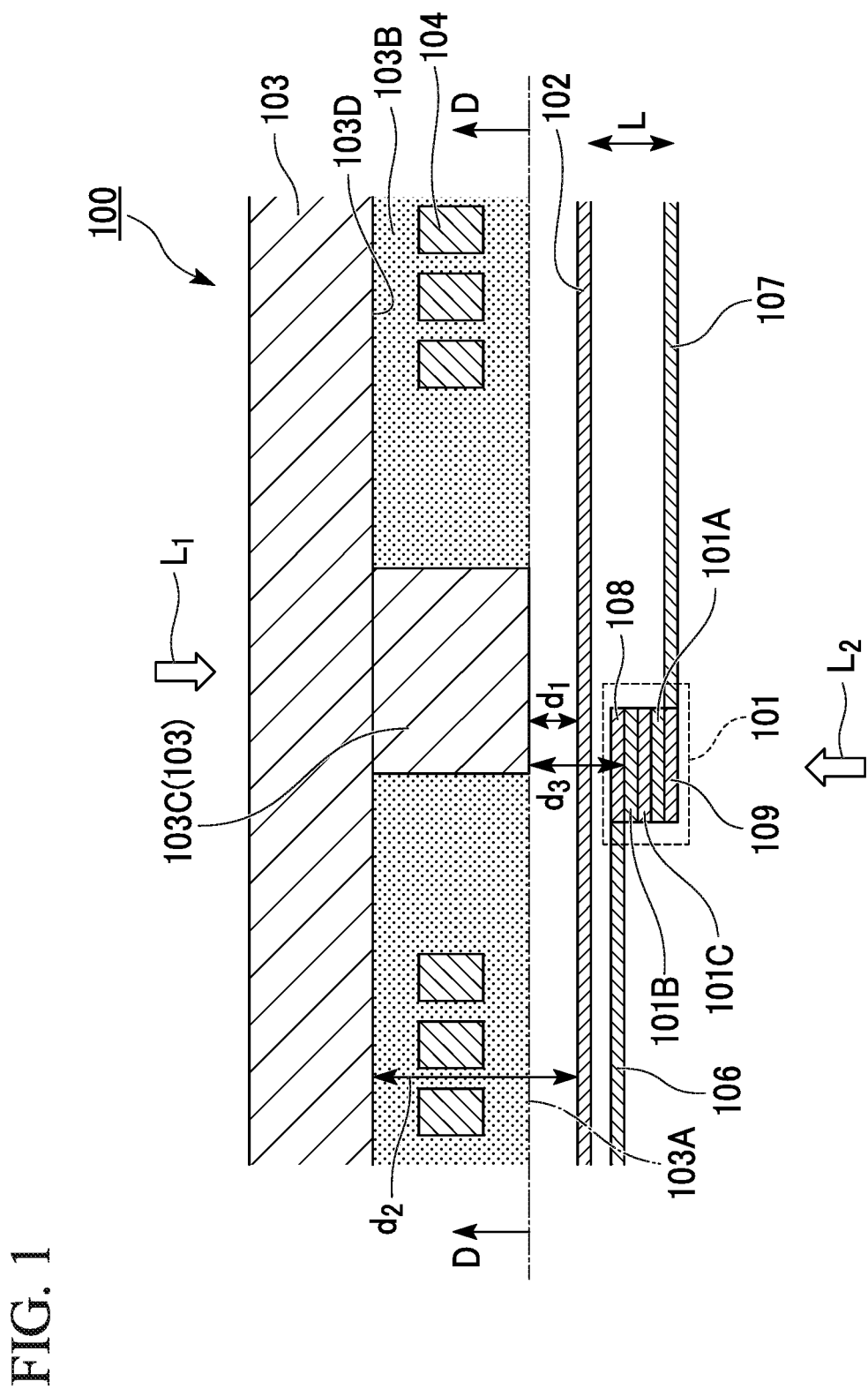
FIG. 1 is a cross-sectional view schematically showing a constitution of a magnetoresistance effect device according to a first embodiment of the disclosure.

The disclosure will be described in detail below by appropriately referring to the drawing. In the drawings used in the following description, enlarged characteristic portions are illustrated in some cases for the sake of convenience so that the characteristics of the disclosure can be easily understood and thus a dimensional ratio and the like of each constituent element is different from the actual size in some cases. Materials and dimensions exemplified in the following description are merely examples and the disclosure is not limited thereto. Modifications within the range in which the effects of the disclosure can be achieved are also possible.

First Embodiment

FIG. 1 is a cross-sectional view schematically illustrating an example of a constitution of a magnetoresistance effect device 100 according to a first embodiment of the disclosure. The magnetoresistance effect device 100 includes at least a magnetoresistance effect element (MR element) 101, a high frequency signal line 102 through which a high frequency current flows, and a magnetic member (first magnetic member) 103. The magnetoresistance effect device 100 is configured such that a magnetic field (high frequency magnetic field) generated from the high frequency signal line 102 and a magnetic field (static magnetic field) generated from the magnetic member 103 are applied to the magnetoresistance effect element 101.

The magnetoresistance effect element 101 is laminated such that a spacer layer (non-magnetic layer or the like) 101C is disposed between a first ferromagnetic layer 101A and a second ferromagnetic layer 101B. One of the first ferromagnetic layer 101A and the second ferromagnetic layer 101B functions as a magnetization fixed layer and the other thereof functions as a magnetization free layer. In this case, a magnetization direction of the magnetization free layer changes relative to a magnetization direction of the magnetization fixed layer. The first ferromagnetic layer 101A and the second ferromagnetic layer 101B have different coercivities and the coercivity of a layer functioning as a magnetization fixed layer is larger than the coercivity of a layer functioning as a magnetization free layer. Thicknesses of the first ferromagnetic layer 101A and the second ferromagnetic layer 101B are preferably about 1 to 10 nm.

When one of the first ferromagnetic layer 101A and the second ferromagnetic layer 101B is used as a magnetization free layer and the other thereof is used as a magnetization fixed layer, it is desirable that the magnetization free layer be disposed so that a distance between the magnetization free layer and the high frequency signal line 102 is shorter than that of the magnetization fixed layer and the high frequency signal line 102.

The first ferromagnetic layer 101A and the second ferromagnetic layer 101B are made of a known material having ferromagnetic properties, for example, a material selected from metals such as Cr, Mn, Co, Fe, and Ni, a ferromagnetic alloy which contains at least one of these metals, and the like so that the first ferromagnetic layer 101A and the second ferromagnetic layer 101B have different coercivities. Furthermore, the first ferromagnetic layer 101A and the second ferromagnetic layer 101B are made of an alloy (specifically, Co—Fe and Co—Fe—B) and the like which contains at least one of these metals and at least one of the elements B, C, and N in some cases.

Also, in order to obtain a higher output, it is desirable to use a Heusler alloy such as $Co_2FeSi$. A Heusler alloy contains an intermetallic compound having a chemical composition represented by $X_2YZ$. Here, X is a transition metal element or a noble metal element from the Co, Fe, Ni, or Cu group in the periodic table, Y is a transition metal from the Mn, V, Cr, or Ti group or an element of the X type, and Z is a typical element from Group III to Group V. For example, $Co_2FeSi$, $Co_2MnSi$, $Co_2Mn_{1-a}Fe_aAl_bSi_{1-b}$, and the like may be exemplified as a Heusler alloy.

In order to fix the magnetization of a ferromagnetic layer (magnetization fixed layer) functioning as a magnetization fixed layer, an antiferromagnetic layer may be added to be in contact with a magnetization fixed layer. Furthermore, the magnetization of the magnetization fixed layer may be fixed using magnetic anisotropy caused by a crystal structure, a shape, and the like. FeO, CoO, NiO, $CuFeS_2$, IrMn, FeMn, PtMn, Cr, Mn, and the like can be used for the antiferromagnetic layer.

It is desirable to use a non-magnetic material for a spacer layer 101C. The spacer layer 101C is formed as a layer made of an electric conductor, an insulator, or a semiconductor or a layer including an electric conduction point made of a conductor in an insulator.

For example, when the spacer layer 101C is made of an insulator, the magnetoresistance effect element 101 is a tunnel magnetoresistance (TMR) effect element and when the spacer layer 101C is made of a metal, the magnetoresistance effect element 101 is a giant magnetoresistance (GMR) effect element.

When an insulating material is used for the spacer layer 101C, an insulating material such as $Al_2O_3$ and MgO can be used. A high magnetoresistance change ratio can be obtained by adjusting a film thickness of the spacer layer 101C so that a coherent tunnel effect is obtained between the first ferromagnetic layer 101A and the second ferromagnetic layer 101B. In order to efficiently use a TMR effect, the thickness of the spacer layer 101C is preferably about 0.5 to 3.0 nm.

When the spacer layer 101C is made of a conductive material, a conductive material such as Cu, Ag, Au or Ru can be used. In order to efficiently use a GMR effect, the thickness of the spacer layer 101C is preferably about 0.5 to 3.0 nm.

When the spacer layer 101C is made of a semiconductor, a material such as ZnO, $In_2O_3$, $SnO_2$, ITO, $GaO_x$, or $Ga_2O_x$ can be used. In this case, the thickness of the spacer layer 101C is preferably about 1.0 to 4.0 nm.

When a layer including an electric conduction point made of a conductor in an insulator is applied as the spacer layer 101C, it is desirable that a structure in which an electric conduction point made of a conductor such as CoFe, CoFeB, CoFeSi, CoMnGe, CoMnSi, CoMnAl, Fe, Co, Au, Cu, Al, or Mg is provided in an insulator made of $Al_2O_3$ or MgO be used. In this case, the thickness of the spacer layer 101C is preferably about 0.5 to 2.0 nm.

The magnetoresistance effect element 101 can also be used as a magnetoresistance effect element in which both of the first ferromagnetic layer 101A and the second ferromagnetic layer 101B are used as magnetization free layers and two magnetization free layers and a spacer layer disposed between the two magnetization free layers are provided. In this case, magnetization directions of the first ferromagnetic layer 101A and the second ferromagnetic layer 101B can be changed relative to each other. For example, a magnetoresistance effect element in which two magnetization free layers are magnetically joined via a spacer layer can be exemplified. To be more specific, a case in which two magnetization free layers are magnetically joined via a spacer layer so that magnetization directions of the two magnetization free layers are antiparallel to each other in a state in which an external magnetic field is not applied is exemplified.

The high frequency signal line 102 is arranged on one side of the magnetoresistance effect element 101 (above the magnetoresistance effect element 101 in FIG. 1) in a direction which is parallel to a lamination direction L of the magnetoresistance effect element 101 and extends in a predetermined direction. A direction in which the high frequency signal line 102 extends may include either a direction parallel to the lamination direction L or a direction intersecting the lamination direction L.

The number of high frequency signal lines 102 is not limited and may be at least one. When a plurality of high frequency signal lines 102 are provided, it is desirable that each of the high frequency signal lines 102 be disposed so that a high frequency magnetic field generated from the high frequency signal line 102 is strengthened at a position of the magnetoresistance effect element 101.

Lines 106 and 107 are connected to both ends of the magnetoresistance effect element 101 in the lamination direction L. A current or a voltage is applied to the magnetoresistance effect element 101 via at least one of the line 106 and the line 107. Furthermore, a signal output from the magnetoresistance effect element 101 is transmitted through at least one of the line 106 and the line 107. For example, a direct current or a direct current voltage is applied to the magnetoresistance effect element 101 through the line 106 and the line 107. Furthermore, for example, a signal (high frequency current or high frequency voltage) output from the magnetoresistance effect element 101 is transmitted through the signal line 107.

In order to increase the electric conductivity to the magnetoresistance effect element 101, it is desirable to provide electrodes at both ends of the magnetoresistance effect element 101. Here, an electrode provided at an upper end of the magnetoresistance effect element 101 in the lamination direction is referred to as an "upper electrode 108" and an electrode provided at a lower end thereof is referred to as a "lower electrode 109." Examples of materials for the line 106, the line 107, the upper electrode 108, and the lower electrode 109 include a conductive material such as Ta, Cu, Au, AuCu, Ru, and Al.

The magnetic member 103 is a member which functions as a magnetic-field applying mechanism configured to apply a static magnetic field to the magnetoresistance effect element 101. The magnetic member 103 is disposed at a position further away from one side of the magnetoresistance effect element 101 than the high frequency signal line 102 when viewed from the magnetoresistance effect element 101. That is to say, although both of the high frequency signal line 102 and the magnetic member 103 are arranged on the same one side of the magnetoresistance effect element 101 in the direction parallel to the lamination direction L, a distance between the magnetic member 103 and the magnetoresistance effect element 101 in the direction parallel to the lamination direction L is larger than a distance between the high frequency signal line 102 and the magnetoresistance effect element 101 in the direction parallel to the lamination direction L.

The magnetic member 103 has a concave portion 103B recessed in a surface 103A facing the high frequency signal line 102 in a direction D in which the magnetic member 103 is spaced apart from the high frequency signal line 102. The recessed direction D is not limited to a direction perpendicular to the facing surface 103A. The facing surface 103A mentioned herein refers to a plane including the outermost surface of the magnetic member 103 located closest to the high frequency signal line 102 side. The facing surface 103A includes an opening surface of the concave portion 103B, but has no inner surface (inner wall surface or inner bottom surface) of the concave portion 103B.

To be specific, it is desirable that a bottom 103D of the concave portion 103B be recessed inward, for example, 100 nm or more from the facing surface 103A. It is desirable that a distance $d_2$ between the bottom 103D of the concave portion 103B and the high frequency signal line 102 in the direction parallel to the lamination direction L be 1.1 times or more a shortest distance $d_1$ between the magnetic member 103 and the high frequency signal line 102. The shortest distance $d_1$ and the distance $d_2$ mentioned herein are distances of a component in a direction parallel to the lamination direction L. Furthermore, it is desirable that a distance between a deepest portion of the bottom 103D in the concave portion 103B and the high frequency signal line 102 in the direction parallel to the lamination direction L be two times or more the shortest distance $d_1$ between the magnetic member 103 and the high frequency signal line 102. It is desirable that the concave portion 103B be filled with a non-magnetic insulator such as aluminum oxide or silicon oxide.

In FIG. 1, a case in which a soft magnetic material (yoke) is used for the magnetic member 103 is exemplified and a coil 104 is wound around a portion 103C which is not recessed enclosed by the concave portion 103B in the magnetic member 103. In this example, the coil 104 is an example of a spiral coil in which a metal pattern is wound in a spiral shape and the illustration of a depth portion of the coil 104 will be omitted herein. In this case, it is possible to change the magnitude of a static magnetic field applied to the magnetoresistance effect element 101 by adjusting the value of a current flowing through the coil 104.

Although FIG. 1 illustrates an example in which the coil 104 is wound around the portion 103C which is not recessed in the magnetic member 103, the coil 104 may be wound around other portions in the magnetic member.

When the magnetic member 103 is made of a soft magnetic material, examples of the magnetic material include a soft magnetic material such as a metal or an alloy including at least one of Fe, Ni, and Co (for example, a NiFe alloy, a CoFe alloy, and the like).

A hard magnetic material (magnet) may be used for the magnetic member 103. In this case, the coil may be wound around the magnetic member 103 as illustrated in FIG. 1 or may not be wound. When a hard magnetic material is used for the magnetic member 103, examples of the magnetic member 103 include a CoPt alloy, an FePt alloy, a CoCrPt alloy, and the like. Furthermore, a material obtained by joining an antiferromagnetic material such as IrMn to the above-described soft magnetic material and fixing a magnetization direction of the soft magnetic material can also be used for the magnetic member 103. In this case, the coil may be wound around the magnetic member 103 as illustrated in FIG. 1 or may not be wound.

Figure 2A:
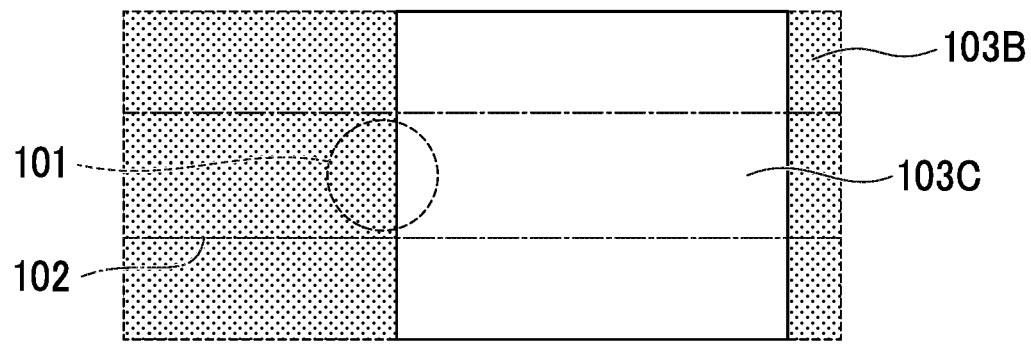
FIGS. 2A to 2C are plan views schematically illustrating an example of a constitution of the magnetoresistance effect device according to the first embodiment of the disclosure.
Figure 2B:
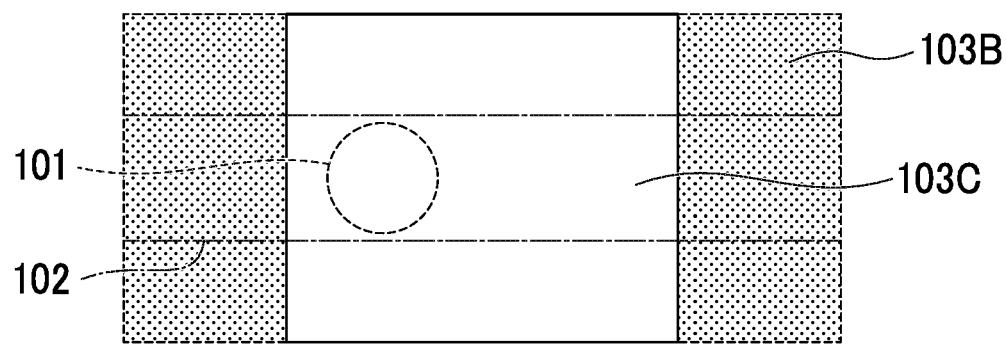

FIGS. 2A and 2B illustrate an example of a constitution of the magnetoresistance effect element 101 illustrated in FIG. 1 when viewed in a plan view in the direction parallel to the lamination direction L (an $L_1$ side or an $L_2$ side illustrated in FIG. 1). Here, only a portion in which three layers, i.e., the first ferromagnetic layer 101A, the second ferromagnetic layer 101B, and the spacer layer 101C, overlap is illustrated as the magnetoresistance effect element 101.

Regardless of the region in the surface 103A facing the high frequency signal line 102 in the magnetic member 103 in which the portion 103C which is not recessed is included, the portion 103C is effective in a state in which an effect of the embodiment which will be described later is obtained. Here, when at least a part of the portion 103C which is not recessed is included in a region in which the portion 103C and the magnetoresistance effect element 101 overlap (when it overlaps the magnetoresistance effect element 101) in the plan view as illustrated in FIG. 2A, a portion in which the distance $d_3$ between the magnetic member 103 and the magnetoresistance effect element 101 is small is formed and a magnetic field applied to the magnetoresistance effect element 101 is strengthened in that portion. Thus, it is desirable that at least a part of the portion 103C which is not recessed and the magnetoresistance effect element 101 overlap.

In order to strengthen a magnetic field applied to the magnetoresistance effect element 101, in the magnetoresistance effect element 101 in the plan view, it is more desirable that an area of a region in which the magnetoresistance effect element 101 and the portion 103C which is not recessed in the magnetic member 103 overlap be large. In addition, as illustrated in FIG. 2B, it is most desirable that the entire region of the magnetoresistance effect element 101 and the portion 103C which is not recessed in the magnetic member 103 overlap.

FIG. 2B illustrates a constitution of a case in which the portion 103C which is not recessed in the magnetic member 103 includes the magnetoresistance effect element 101 and a circumferential edge portion of the portion 103C which is not recessed in the magnetic member 103 is at an outer side of a circumferential edge portion of the magnetoresistance effect element 101 in the plan view. In this case, it is possible to apply only a uniform magnetic field which is not affected by the end portion among magnetic fields generated from the portion 103C which is not recessed to the magnetoresistance effect element 101 in the magnetic member 103. Thus, the above-described constitution is desirable.

Figure 2C:
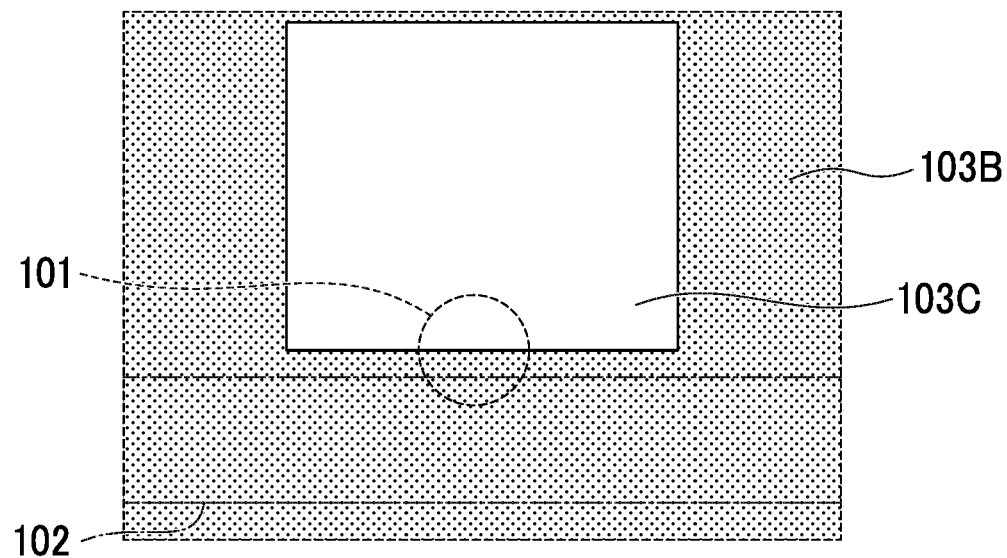

FIG. 2C illustrates a constitution of a case in which the portion 103C which is not recessed in the magnetic member 103 and the high frequency signal line 102 do not overlap in the plan view in the direction parallel to the lamination direction L. In this case, a constitution can be provided such that the magnetoresistance effect element 101 and at least a part of the portion 103C which is not recessed in the magnetic member 103 overlap and the high frequency signal line 102 and the portion 103C which is not recessed in the magnetic member 103 do not overlap. That is to say, the magnetic member 103 is disposed so that the entire high frequency signal line 102 and the portion 103C which is not recessed in the magnetic member 103 do not overlap and it is possible to increase a distance from the magnetic member 103 over the entire high frequency signal line 102. Therefore, it is possible to reduce a capacitance component between the high frequency signal line 102 and the magnetic member 103 as compared with when the portion 103C which is not recessed in the magnetic member 103 and the high frequency signal line 102 overlap in the plan view.

Figure 3A:
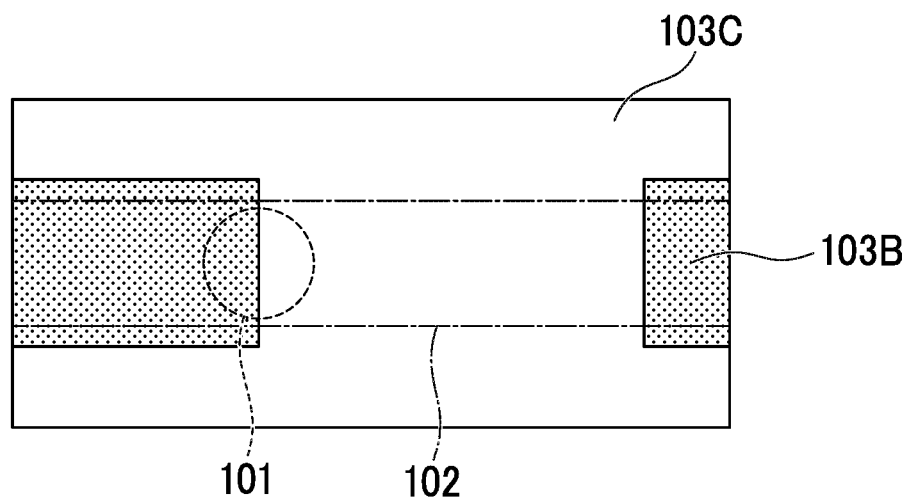
FIGS. 3A to 3C are plan views schematically illustrating an example of another constitution of the magnetoresistance effect device according to the first embodiment of the disclosure.
Figure 3B:
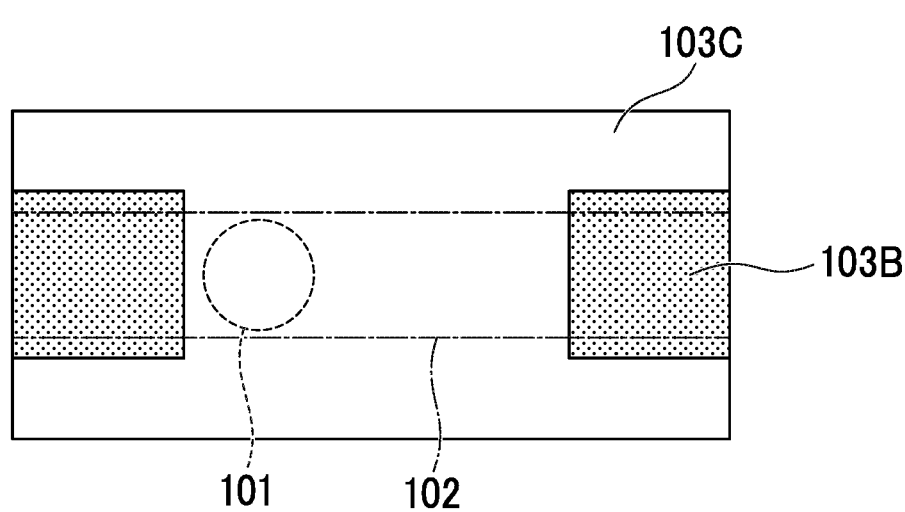
Figure 3C:
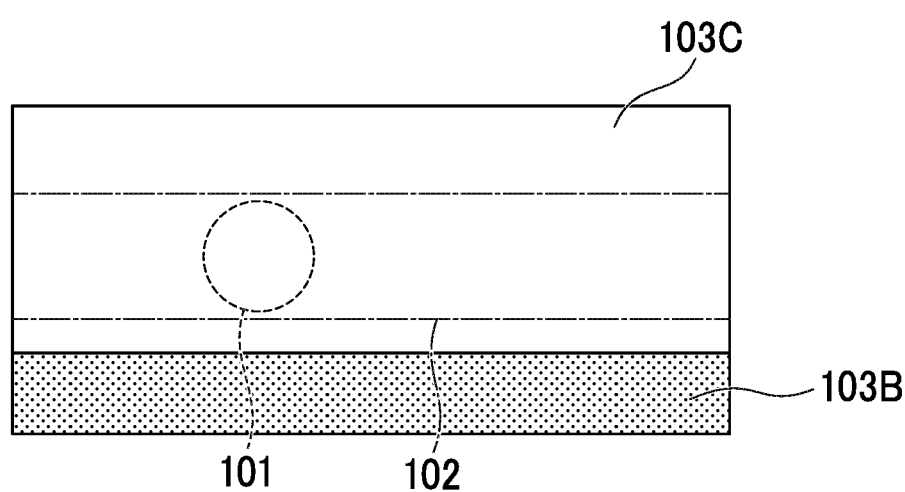

FIGS. 3A to 3C illustrate an example of another constitution of the case in which the magnetoresistance effect element 101 illustrated in FIG. 1 is viewed in the plan view in the lamination direction L ($L_1$ side or $L_2$ side). The portion 103C which is not recessed in the magnetic member 103 and a part of the magnetoresistance effect element 101 overlap in FIG. 3A and the portion 103C which is not recessed in the magnetic member 103 and the entire magnetoresistance effect element 101 overlap in FIG. 3B.

The concave portion 103B is for the purpose of reducing a capacitance component present between the magnetic member 103 and the high frequency signal line 102. The present capacitance component is large in a region directly above the high frequency signal line 102 with reference to FIG. 1, that is, a region in which the magnetic member 103 and the high frequency signal line 102 overlap in the plan view, and is reduced as it goes away from this region. Therefore, as illustrated in FIGS. 3A and 3B, the concave portion 103B may not be provided in the magnetic member 103 in a region away from the region in which the magnetic member 103 and the high frequency signal line 102 overlap.

In FIG. 3C, most of the high frequency signal line 102 and the portion 103C which is not recessed in the magnetic member 103 overlap in the plan view. That is to say, the magnetic member 103 directly above the high frequency signal line 102 does not have the concave portion 103B over the entire most portion of the high frequency signal line 102 with reference to FIG. 1. Also in such a case, as illustrated in FIG. 1, as long as the magnetic member 103 which does not overlap the high frequency signal line 102 (obliquely above the high frequency signal line 102 with reference to FIG. 1) slightly has the concave portion 103B, it is possible to obtain an effect of reducing a capacitance component as compared with a case in which the magnetic member 103 does not have the concave portion 103B at all.

A path through which a high frequency current flows can be formed between the magnetic member and the high frequency signal line due to an influence of a capacitance component present between the magnetic member and the high frequency signal line. Thus, the high frequency characteristics of a magnetoresistance effect device deteriorate in some cases when the capacitance component is large. For example, a part of a high frequency current flowing through the high frequency signal line is shunted toward the magnetic member side and thus the intensity of a high frequency magnetic field applied to the magnetoresistance effect element is reduced in some cases. For this reason, when the magnetoresistance effect device is applied to, for example, a high frequency filter which will be described later, the passing characteristics of the high frequency filter deteriorate in some cases.

On the other hand, in the magnetoresistance effect device 100 according to the embodiment, the magnetic member 103 functioning as a magnetic-field applying mechanism has the concave portion 103B which is recessed in the direction D away from the high frequency signal line 102, that is, a region in which a distance from the high frequency signal line 102 is locally long in the surface 103A facing the high frequency signal line 102. For this reason, an amount of the capacitance component present between the high frequency signal line 102 and the magnetic member 103 which is present in this region is small in correspondence to an increase in the distance. Therefore, in the magnetoresistance effect device 100 according to the embodiment, it is possible to prevent the deterioration of the above-described high frequency characteristic (for example, passing characteristic) as a whole.

(Modification 1)

Figure 4:
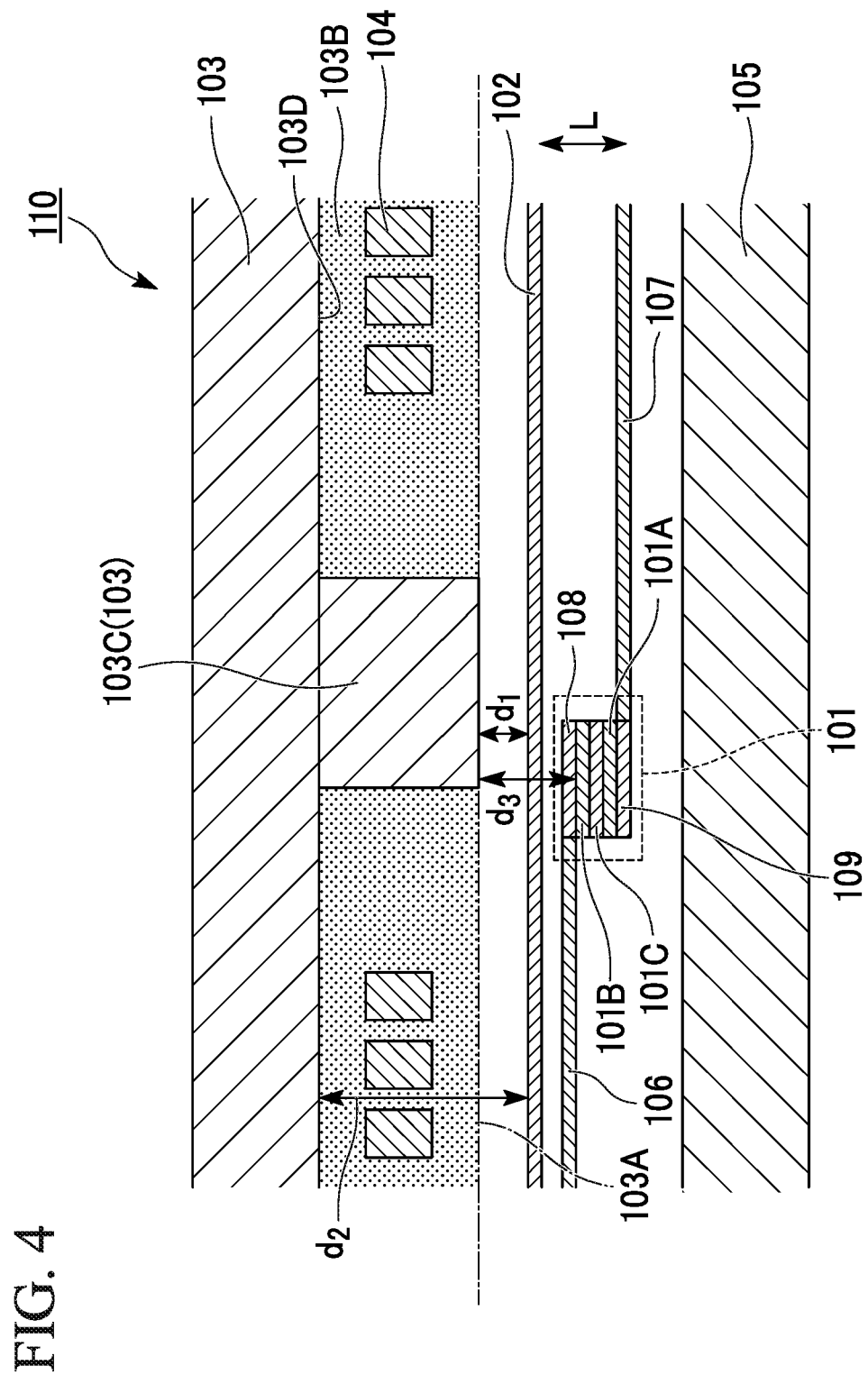
FIG. 4 is a cross-sectional view schematically showing a constitution of a magnetoresistance effect device according to Modification 1 of the first embodiment of the disclosure.

FIG. 4 is a cross-sectional view schematically illustrating an example of a constitution of a magnetoresistance effect device 110 according to Modification 1 of the embodiment. Constituent elements that are the same as those of the first embodiment will be denoted by the same reference numerals. In the magnetoresistance effect device 110, a second magnetic member 105 is arranged on the opposite side of a first magnetic member 103 with respect to the magnetoresistance effect element 101. It is desirable that the first magnetic member 103 and the second magnetic member 105 be joined directly or via another magnetic member in a region on a side outer than an outer circumferential portion of the coil 104.

Although a case in which the magnetoresistance effect element 101 and the high frequency signal line 102 are sandwiched by two magnetic members (the first magnetic member 103 and the second magnetic member 105) has been exemplified in FIG. 4, the high frequency signal line 102 may not be sandwiched by two magnetic members. A constitution other than the second magnetic member 105 is the same as the constitution of the above-described embodiment (FIG. 1). As a material of the second magnetic member 105, the same material as that exemplified as the material of the first magnetic member 103 can be used. The material of the second magnetic member 105 may be the same as or different from the material of the first magnetic member 103.

In this case, when the second magnetic member 105 is arranged, a large amount of magnetic flux generated from the first magnetic member 103 extends toward the second magnetic member 105 and passes through the magnetoresistance effect element 101 in the middle thereof. As a result, a stronger magnetic field is applied to the magnetoresistance effect element 101 and accordingly it is possible to further increase a distance between the first magnetic member 103 and the high frequency signal line 102. Therefore, it is possible to further decrease a capacitance component present between the first magnetic member 103 and the high frequency signal line 102.

Application Example

Figure 5:
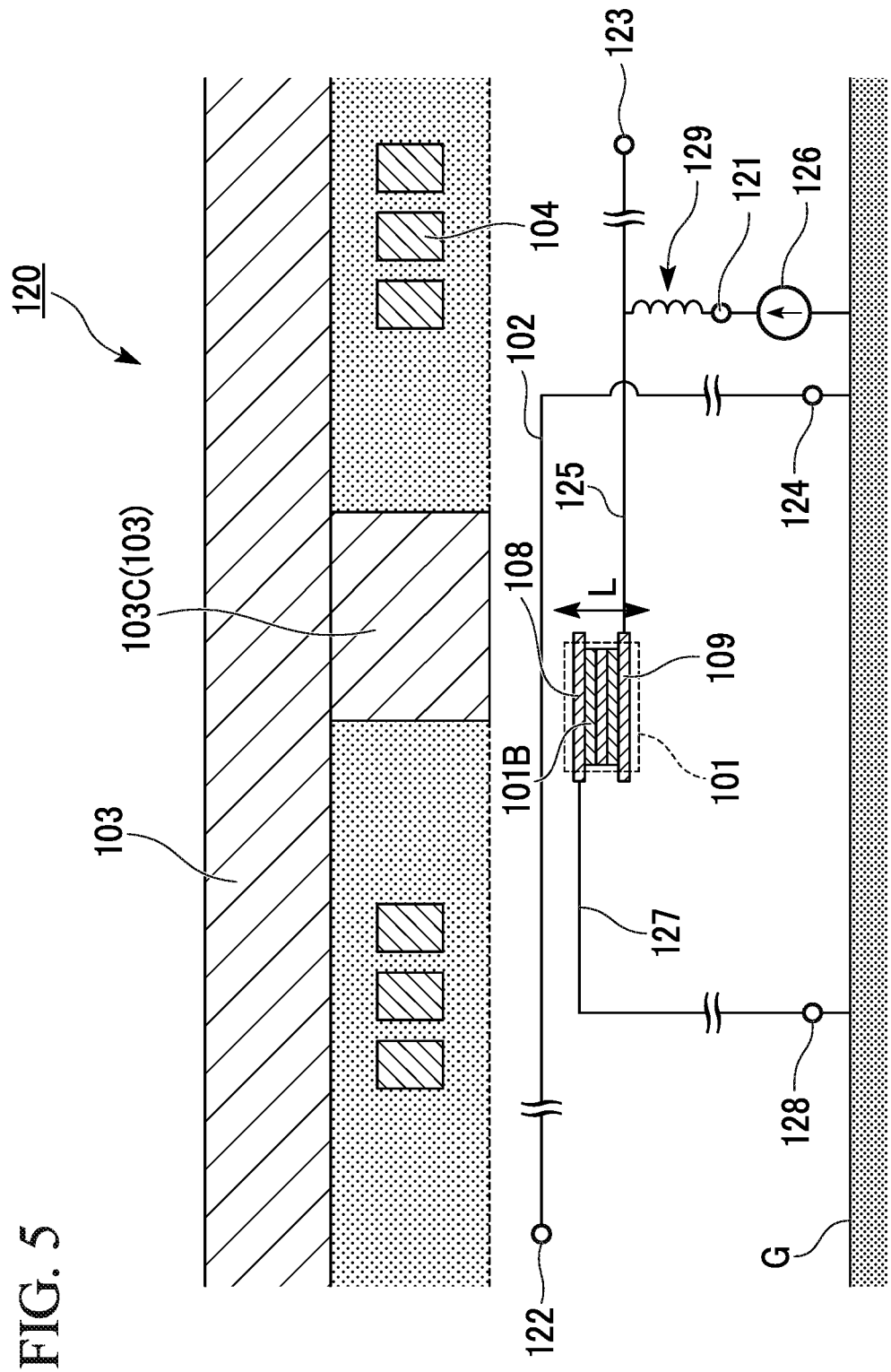
FIG. 5 is a diagram illustrating an example of a constitution of a circuit of a high frequency device having a magnetoresistance effect device of the disclosure applied thereto.

FIG. 5 illustrates an example of a circuit of a high frequency device 120 to which the above-described magnetoresistance effect device 100 is applied. The high frequency device 120 includes the magnetoresistance effect element 101, the high frequency signal line 102, a first magnetic member (magnetic-field applying mechanism) 103, and a direct current (DC) applying terminal 121.

The high frequency device 120 receives a signal through a first port 122 as an input and outputs a signal through a second port 123. It should be noted that the high frequency device 120 having other circuit elements and the like incorporated therein in addition to the above-described magnetoresistance effect element, high frequency signal line, and first magnetic member are collectively referred to as a magnetoresistance effect device in some cases.

<Magnetoresistance Effect Element and Magnetic-Field Applying Mechanism>

The magnetoresistance effect element 101 and the first magnetic member 103 may be, for example, those configured to satisfy the above-described constitution of the magnetoresistance effect device 100 according to the first embodiment. In this application example, an example in which the first ferromagnetic layer 101A functions as a magnetization fixed layer and the second ferromagnetic layer 101B functions as a magnetization free layer will be described.

A frequency of an output signal can be set using the first magnetic member 103. The frequency of the output signal changes in accordance with a ferromagnetic resonance frequency of the second ferromagnetic layer 101B functioning as a magnetization free layer. The ferromagnetic resonance frequency of the second ferromagnetic layer 101B changes in accordance with an effective magnetic field in the second ferromagnetic layer 101B. The effective magnetic field in the second ferromagnetic layer 101B is affected by an external magnetic field (static magnetic field). For this reason, it is possible to change the ferromagnetic resonance frequency of the second ferromagnetic layer 101B by changing the magnitude of an external magnetic field applied from the first magnetic member 103 to the second ferromagnetic layer 101B.

<First Port and Second Port>

The first port 122 is an input terminal of the high frequency device 120. The first port 122 corresponds to one end of the high frequency signal line 102. An AC signal (high frequency signal) can be applied to the high frequency device 120 by connecting an alternating current (AC) signal source (not shown) to the first port 122. The high frequency signal applied to the high frequency device 120 is, for example, a signal having a frequency of 100 MHz or higher.

The second port 123 is an output terminal of the high frequency device 120. The second port 123 corresponds to one end of an output signal line 125 configured to transmit a signal output from the magnetoresistance effect element 101. The output signal line 125 corresponds to the line 107 illustrated in FIG. 1.

<High Frequency Signal Line>

The high frequency signal line 102 in FIG. 5 has one end connected to the first port 122.

Also, the high frequency device 120 is used in a state in which the other end of the high frequency signal line 102 is connected to a reference potential via a reference potential terminal 124. In FIG. 5, the other end is connected to a ground G as a reference potential. The ground G can be provided outside the high frequency device 120. A high frequency current flows in the high frequency signal line 102 in accordance with a potential difference between a high frequency signal input to the first port 122 and the ground G. When the high frequency current flows in the high frequency signal line 102, a high frequency magnetic field is generated from the high frequency signal line 102. This high frequency magnetic field is applied to the second ferromagnetic layer 101B in the magnetoresistance effect element 101.

<Output Signal Line and Line>

The output signal line 125 propagates a signal output from the magnetoresistance effect element 101. The signal output from the magnetoresistance effect element 101 is a signal of a frequency selected using a ferromagnetic resonance of the second ferromagnetic layer 101B. The output signal line 125 in FIG. 5 has one end connected to the magnetoresistance effect element 101 and the other end connected to the second port 123. That is to say, the output signal line 125 connects the magnetoresistance effect element 101 and the second port 123.

Also, a condenser may be provided in the output signal line 125 between the second port 123 and a portion in which a closed circuit is formed by a power source 126, the output signal line 125, the magnetoresistance effect element 101, a line 127, and the ground G (for example, the output signal line 125 between a connection place of an inductor 129 with respect to the output signal line 125 and the second port 123). By providing the condenser to this portion, it is possible to prevent an invariant component of a current from being added to the output signal output from the second port 123.

The line 127 has one end connected to the magnetoresistance effect element 101. The line 127 corresponds to the line 106 illustrated in FIG. 1. Furthermore, the high frequency device 120 is used in a state in which the other end of the line 127 is connected to the reference potential via a reference potential terminal 128. Although the line 127 is connected to the ground G common to the reference potential of the high frequency signal line 102 in FIG. 8, the line 127 may be connected to other reference potentials. In order to simplify a circuit constitution, it is desirable that the reference potential of the high frequency signal line 102 and the reference potential of the line 127 be common.

As shapes of each line and the ground G, it is desirable to apply a micro strip line (MSL) type or a coplanar wave guide (CPW) type. When the micro strip line (MSL) type or the coplanar wave guide (CPW) type is applied, it is desirable to design a line width or a distance between grounds so that a characteristic impedance of a line and an impedance of a circuit system are equal. By designing in this way, it is possible to suppress transmission loss of a line.

<DC Applying Terminal>

The DC applying terminal 121 is connected to the power source 126 and applies a direct current or a direct current voltage in the lamination direction of the magnetoresistance effect element 101. In this specification, a direct current is a current whose direction does not change in accordance with time and may include a current whose magnitude changes in accordance with time. Furthermore, a direct current voltage is a voltage whose direction does not change in accordance with time and may include a voltage whose magnitude changes in accordance with time. The power source 126 may be a DC source or a DC voltage source.

The power source 126 may be a DC source capable of generating a constant direct current and a DC voltage source capable of generating a constant direct current voltage. Furthermore, the power source 126 may be a DC source capable of changing the magnitude of the value of the generated direct current and a DC voltage source capable of changing the magnitude of the value of the generated direct current voltage.

A current density of a current applied to the magnetoresistance effect element is preferably lower than an oscillation threshold value current density of the magnetoresistance effect element. The oscillation threshold value current density of the magnetoresistance effect element refers to a current density which is a threshold value at which the magnetization of a ferromagnetic layer functioning as a magnetization free layer of the magnetoresistance effect element starts the precession at a constant frequency and a constant amplitude and the magnetoresistance effect element oscillates (an output (resistance value) of the magnetoresistance effect element fluctuates at a constant frequency and a constant amplitude).

The inductor 129 is disposed between the DC applying terminal 121 and the output signal line 125. The inductor 129 cuts off a high frequency component of a current and passes an invariant component of the current. An output signal (high frequency signal) output from the magnetoresistance effect element 101 effectively flows to the second port 123 by the inductor 129. Furthermore, the invariant component of the current flows through the closed circuit formed by the power source 126, the output signal line 125, the magnetoresistance effect element 101, the line 127, and the ground G by the inductor 129.

A chip inductor, an inductor with a pattern line, a resistance element having an inductor component, or the like can be used for the inductor 129. An inductance of the inductor 129 is preferably 10 nH or higher.

<Function of High Frequency Device>

When a high frequency signal is input to the high frequency device 120 through the first port 122, a high frequency current corresponding to the high frequency signal flows in the high frequency signal line 102. A high frequency magnetic field generated by the high frequency current flowing in the high frequency signal line 102 is applied to the second ferromagnetic layer 101B in the magnetoresistance effect element 101.

The magnetization of the second ferromagnetic layer 101B functioning as a magnetization free layer greatly vibrates when a frequency of the high frequency magnetic field applied to the second ferromagnetic layer 101B by the high frequency signal line 102 is close to the ferromagnetic resonance frequency of the second ferromagnetic layer 101B. This phenomenon is a ferromagnetic resonance phenomenon.

When the vibration of the magnetization of the second ferromagnetic layer 101B increases, a change in resistance value of the magnetoresistance effect element 101 increases. For example, when a constant direct current is applied from the DC applying terminal 121 to the magnetoresistance effect element 101, a change in resistance value of the magnetoresistance effect element 101 is output from the second port 123 as a change in potential difference between the upper electrode 108 and the lower electrode 109. Furthermore, for example, when a constant direct current voltage is applied from the DC applying terminal 121 to the magnetoresistance effect element 101, the change in resistance value of the magnetoresistance effect element 101 is output through the second port 123 as a change in value of a current flowing between the upper electrode 108 and the lower electrode 109.

That is to say, when a frequency of a high frequency signal input through the first port 122 is a frequency close to the ferromagnetic resonance frequency of the second ferromagnetic layer 101B, an amount of variation of a resistance value of the magnetoresistance effect element 101 is large and a large signal is output through the second port 123. On the other hand, when the frequency of the high frequency signal is deviated from the ferromagnetic resonance frequency of the second ferromagnetic layer 101B, an amount of variation of a resistance value of the magnetoresistance effect element 101 is small and almost no signal is output through the second port 123. In other words, the high frequency device 120 functions as a high frequency filter capable of selectively passing a high frequency signal with a specific frequency.

<Other Applications>

Also, although a case in which the high frequency device 120 is used as a high frequency filter has been presented in the above-described application example, the high frequency device 120 can also be applied to a high frequency device such as an isolator, a phase shifter, and an amplifier (amp).

When the high frequency device 120 is used as an isolator, a signal is input through the second port 123. The high frequency device 120 functions as an isolator because a signal is not output through the first port 122 even when the signal is input through the second port 123.

Also, when the high frequency device 120 is used as a phase shifter, attention is paid to a frequency at an arbitrary point in a frequency band to be output in a case in which the frequency band to be output changes.

When the frequency band to be output changes, a phase at a specific frequency changes. Thus, the high frequency device 120 is used as a phase shifter.

When the high frequency device 120 is used as an amplifier, a direct current or a direct current voltage applied from the power source 126 is set to a predetermined magnitude or more. Thus, a signal output through the second port 123 is larger than a signal input through the first port 122 and the high frequency device 120 is used as an amplifier.

As described above, the high frequency device 120 can function as a high frequency device such as a high frequency filter, an isolator, a phase shifter, and an amplifier.

Although a case in which one magnetoresistance effect element 101 is provided has been exemplified in FIG. 5, a plurality of magnetoresistance effect elements 101 may be provided. In this case, the plurality of magnetoresistance effect elements 101 may be connected to each other in parallel or may be connected to each other in series. For example, when a plurality of magnetoresistance effect elements 101 having different ferromagnetic resonance frequencies are used, it is possible to widen a selected frequency band (pass frequency band). Furthermore, a constitution in which a high frequency magnetic field generated by the output signal line 125 which outputs an output signal from one magnetoresistance effect element 100 is applied to another magnetoresistance effect element 101 may be provided. With such a constitution, since a signal to be output is filtered a plurality of times, the filtering accuracy of a high frequency signal can be increased.

Also, the DC applying terminal 121 may be connected between the inductor 129 and the ground G and may be connected between the upper electrode 108 and the ground G.

A resistance element may be used instead of the inductor 129 in the above-described application example. The resistance element has a function of cutting off a high frequency component of a current using a resistance component. The resistance element may be either a chip resistance or a resistance due to a pattern line. The resistance value of the resistance element is preferably a characteristic impedance of the output signal line 125 or higher. For example, when a characteristic impedance of the output signal line 125 is 50Ω and a resistance value of the resistance element is 50Ω, it is possible to cut off high frequency power of 45% using the resistance element. Furthermore, when a characteristic impedance of the output signal line 125 is 50Ω and a resistance value of the resistance element is 500Ω, it is possible to cut off high frequency power of 90% using the resistance element. Even in this case, it is possible to effectively pass an output signal output from the magnetoresistance effect element 101 to the second port 123.

When the power source 126 connected to the DC applying terminal 121 has a function of cutting off a high frequency component of a current and at the same time passing an invariant component of the current in the above-described application example, the inductor 129 may be omitted. Even in this case, it is possible to effectively pass an output signal output from the magnetoresistance effect element 101 to the second port 123.

Also, the magnetoresistance effect device 110 mentioned in Modification 1 may be applied instead of the magnetoresistance effect device 100 in the above-described application example.

In a magnetoresistance effect device of the disclosure, the magnetic member functioning as a magnetic-field applying mechanism has a region which is recessed in the direction away from the high frequency signal line, that is, a region in which a distance from the high frequency signal line is locally long in the surface facing the high frequency signal line. For this reason, an amount of the capacitance component present between the high frequency signal line and the magnetic member which is present in this region is small in correspondence to an increase in the distance. Therefore, in the magnetoresistance effect device of the disclosure, it is possible to prevent the deterioration of a high frequency characteristic as a whole.

The invention claimed is:

1. A magnetoresistance effect device, comprising:
   a magnetoresistance effect element including a first ferromagnetic layer, a second ferromagnetic layer, and a spacer layer, the first ferromagnetic layer, the second ferromagnetic layer and the spacer layer being laminated in a lamination direction with the spacer layer between the first ferromagnetic layer and the second ferromagnetic layer;
   a high frequency signal line arranged on one side of the magnetoresistance effect element in a direction parallel to the lamination direction; and
   a magnetic member arranged on the one side of the magnetoresistance effect element,
   wherein the magnetic member is arranged further away from the magnetoresistance effect element in the direction parallel to the lamination direction than the high frequency signal line,
   wherein the magnetic member has a concave portion which is recessed in a direction away from the high frequency signal line in a surface facing the high frequency signal line, and
   wherein at least a part of a region which is not recessed of the surface in the magnetic member facing the high frequency signal line and the magnetoresistance effect element overlap when viewed in a direction parallel to the lamination direction.

2. The magnetoresistance effect device according to claim 1, wherein a distance between a deepest portion of the concave portion and the high frequency signal line in the direction parallel to the lamination direction is two times or more the shortest distance between the magnetic member and the high frequency signal line.

3. A magnetoresistance effect device, comprising:
   a magnetoresistance effect element including a first ferromagnetic layer, a second ferromagnetic layer, and a spacer layer, the first ferromagnetic layer, the second ferromagnetic layer, and the spacer layer being laminated in a lamination direction with the spacer layer between the first ferromagnetic layer and the second ferromagnetic layer;
   a high frequency signal line arranged on one side of the magnetoresistance effect element in a direction parallel to the lamination direction; and
   a magnetic member arranged on the one side of the magnetoresistance effect element,
   wherein the magnetic member is arranged further away from the magnetoresistance effect element in the direction parallel to the lamination direction than the high frequency signal line,
   wherein the magnetic member has a concave portion which is recessed in a direction away from the high frequency signal line in a surface facing the high frequency signal line, and
   wherein the magnetic member is wound with a coil, or the magnetic member is composed of a hard magnetic material.

4. The magnetoresistance effect device according to claim 3, wherein at least a part of a region which is not recessed of the surface in the magnetic member facing the high frequency signal line and the magnetoresistance effect element overlap when viewed in a direction parallel to the lamination direction.

5. The magnetoresistance effect device according to claim 3, wherein a distance between a deepest portion of the concave portion and the high frequency signal line in the direction parallel to the lamination direction is two times or more the shortest distance between the magnetic member and the high frequency signal line.

6. A magnetoresistance effect device, comprising:
   a magnetoresistance effect element including a first ferromagnetic layer, a second ferromagnetic layer, and a spacer layer, the first ferromagnetic layer, the second ferromagnetic layer, and the spacer layer being laminated in a lamination direction with the spacer layer between the first ferromagnetic layer and the second ferromagnetic layer;
   a high frequency signal line arranged on one side of the magnetoresistance effect element in a direction parallel to the lamination direction; and
   a magnetic member arranged on the one side of the magnetoresistance effect element, wherein the magnetic member is arranged further away from the magnetoresistance effect element in the direction parallel to the lamination direction than the high frequency signal line, wherein the magnetic member has a concave portion which is recessed in a direction away from the high frequency signal line in a surface facing the high frequency signal line, and wherein the magnetic member has a magnetization direction that is fixed by joining an antiferromagnetic material to the magnetic member.

7. The magnetoresistance effect device according to claim 6, wherein at least a part of a region which is not recessed of the surface in the magnetic member facing the high frequency signal line and the magnetoresistance effect element overlap when viewed in a direction parallel to the lamination direction.

8. The magnetoresistance effect device according to claim 6, wherein a distance between a deepest portion of the concave portion and the high frequency signal line in the direction parallel to the lamination direction is two times or more the shortest distance between the magnetic member and the high frequency signal line.

* * * * *